United States Patent
Sugai

(10) Patent No.: US 6,569,756 B1
(45) Date of Patent: May 27, 2003

(54) METHOD FOR MANUFACTURING A SEMICONDUCTOR DEVICE

(75) Inventor: Kazumi Sugai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/361,984

(22) Filed: Jul. 28, 1999

(30) Foreign Application Priority Data

Jul. 28, 1998 (JP) ............................................. 10-213336

(51) Int. Cl.⁷ ...................... H01L 21/4763; H01L 21/44
(52) U.S. Cl. ....................................... 438/618; 438/654
(58) Field of Search ................................. 438/618, 654

(56) References Cited

U.S. PATENT DOCUMENTS

| | | | | |
|---|---|---|---|---|
| 5,882,498 A | * | 3/1999 | Dubin et al. | 205/123 |
| 5,981,377 A | * | 11/1999 | Koyama | 438/633 |
| 5,989,623 A | * | 11/1999 | Chen et al. | 427/97 |
| 6,083,840 A | * | 7/2000 | Mravic et al. | 438/693 |

FOREIGN PATENT DOCUMENTS

| | | |
|---|---|---|
| JP | 1074763 | 3/1998 |
| JP | 1079389 | 3/1998 |
| JP | 10-79389 | 3/1998 |
| KR | 1999-0059087 | 7/1999 |

* cited by examiner

*Primary Examiner*—Olik Chaudhuri
*Assistant Examiner*—William M. Brewster
(74) *Attorney, Agent, or Firm*—Young & Thompson

(57) ABSTRACT

A method for forming wiring composed of copper materials by using a CVD method by which the number of processes is reduced and copper metal wiring is effectively formed. After a first copper thin film having a film thickness adjusted so as not to virtually cause bumps and dips attributable to crystal particles on a surface of the film is formed by using the CVD method, with a barrier metal film put between the first copper thin film and the insulating film, on the insulating film covering the semiconductor substrate and containing the connecting trench, reflow processing is performed to make flowing the surface of the copper thin film. Then, after the second copper thin film having a sufficient film thickness to impart a wiring function obtained in a short time by using the sputtering method is formed on the first copper thin film, planarization is carried out on the surface by the CMP method to form copper wiring.

3 Claims, 6 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device and more particularly to a method for manufacturing a semiconductor device for forming, by using a CVD (Chemical Vapor Deposition) method, wiring composed of copper only or materials in which copper forms the principal constituent of the wiring on a connecting trench or connecting hole of an insulating film covering a semiconductor substrate.

2. Description of the Related Art

An LSI (Large Scale Integrated) circuit such as a microprocessor or memory known as a typical semiconductor device is currently scaled down as an integration degree thereof increases and, as a result, a semiconductor area constituting each device is shrinking. Moreover, when wiring is formed in each semiconductor area, a diameter of a connecting hole such as a contact hole or via hole or of a connecting trench in which wiring is buried, each being formed on an insulating film, is also made smaller. To meet the need for increasing wiring density, a multi-level interconnect technology, by which wiring is stacked in a multi-layer state in the direction of thickness of a semiconductor substrate, has been developed.

In such LSIs, high-speed microprocessors in particular, since an operational problem stems mainly from high electrical resistance of wiring, it is desirous to reduce its electrical resistance. Conventional materials, for wiring employed in semiconductor devices including LSIs are aluminum (Al) or aluminum metals, in which aluminum forms the principal constituent thereof, which are excellent in their electrical characteristics, processability, etc.

However, such aluminum metals have a weakness of low resistance to electro-migration and/or to stress migration. For this reason, instead of aluminum metals, copper or copper metals, in which copper forms the principal constituent thereof, are widely used which have less electrical resistance compared with aluminum or aluminum metals and which are excellent in resistance to electro-migration and/or stress migration.

A thin film composed of such copper or copper metals is formed on a semiconductor substrate by using a CVD method, a sputtering method or a PVD (Physical Vapor Deposition) method in general. In many cases, the CVD method is used because it is excellent in step coverage.

When a copper metal thin film is formed by using the CVD method, it is known that, if the thickness of the copper thin film to be used as wiring is comparatively large, a void (bubble and/or porosity) may occur in the thin film. The void in the wiring causes high electrical resistance and/or breakage thereof, reducing reliability of semiconductor devices.

Accordingly, a method for forming copper wiring being free from the occurrence of such voids has been expected. Such a method for manufacturing semiconductor devices to avoid the effect of voids in copper wiring formed by using a CVD method is disclosed in Japanese Laid-open Patent Application No. Hei10-79389. The disclosed method for manufacturing semiconductor devices is described below in order of processes by referring to FIGS. 7A to 7D.

As shown in FIG. 7A, after concave portions 63A and 63B are formed on an insulating film 62 composed of a silicon oxide film, with a film thickness of about 0.1 $\mu$m, covering a silicon substrate 61, a first copper thin film 65 with a film thickness of about 150 nm is formed by using a CVD method on the silicon substrate containing the concave portions 63A and 63B, with a diffusion preventive film 64 put between the insulating film 62 and the copper thin film 65. At this point, voids 66A and 66B are formed on the copper thin film 65.

Then, as depicted in FIG. 7B, by performing an annealing processing on the silicon substrate 61 at a temperature of about 400° C. for about 10 minutes, the first copper thin film 65 is made flowing (i.e., being put in reflow process) and poured into the voids 66A and 66B. Subsequently, a second copper thin film 66 is formed on the first copper thin film 65 by using the CVD method as shown in FIG. 7C. Then, the surface of the first and second copper thin films 65 and 66 is polished by a CMP (Chemical Mechanical Polishing) method and copper wiring 67, which is buried in each of the concave portions 63A and 63B, is formed. Thus, the copper wiring 67 being free from voids can be obtained.

However, in the above disclosed method for manufacturing semiconductor devices, there is a problem in that, if a large thickness of the copper thin film is required to impart a wiring function, processes of forming the thin film by using the CVD method and of reflowing have to be repeated several times, thus causing an increase in the number of processes, as a result, leading to inefficient manufacturing.

That is, in the conventional method for manufacturing semiconductor devices, since wiring having a sufficient thickness to impart a wiring function is obtained by combining a process, wherein a copper thin film is formed in such a manner that the film thickness is so small that voids are not produced even by the CVD method, with a process of reflow, the CVD process has to be divided into, for example, three parts and, between the divided processes, the process of reflow has to be put, thus inevitably causing insufficient formation of the copper wiring.

SUMMARY OF THE INVENTION

In view of the above, it is an object of the present invention to provide a method for manufacturing a semiconductor device to enable the reduction of the number of processes and efficient formation of wiring in the process of forming copper metals by using a CVD method.

According to a first aspect of the present invention, there is provided a method for manufacturing a semiconductor device for forming wiring on a connecting trench or a connecting hole of an insulating film covering a semiconductor substrate comprising the steps of:

forming, by using a CVD electrical method, a first conductive thin film composed of a desired metal and having a film thickness adjusted so as not to virtually cause bumps and dips attributable to crystal particles on a surface of the thin film on the semiconductor substrate containing the connecting trench or connecting hole;

reflowing by performing heat treatment on the semiconductor substrate and to making flowing the surface of the first conductive thin film;

forming, by methods other than the CVD method, a second conductive thin film composed of a desired metal and having a film thickness that is larger than the depth of the connecting trench or connecting hole on the first conductive thin film; and planarizing the second conductive thin film.

According to a second aspect of the present invention, there is provided a method for manufacturing a semiconductor device for forming wiring composed of copper only or materials in which copper forms the principal constituent thereof on a connecting trench or connecting hole of an insulating film covering a semiconductor substrate comprising the steps of:

forming, by using a CVD method, a first conductive thin film composed of copper only or materials in which copper forms the principal constituent thereof and having a film thickness adjusted so as not to cause bumps and dips attributable to crystal particles on the surface of the thin film on the semiconductor substrate containing the connecting trench or connecting hole;

reflowing by performing heat treatment on the semiconductor substrate and to making flowing the surface of the first conductive thin film;

forming, by methods other than the CVD method, a second conductive thin film composed of copper only or materials in which copper forms the principal constituent thereof and having a film thickness that is larger than the depth of the connecting trench or connecting hole on the first conductive thin film; and planarizing the second conductive thin film.

In the foregoing, a preferable mode is one that wherein contains a step of forming, before having the first conductive thin film grown, a barrier metal film on the semiconductor substrate containing the connecting trench or connecting hole.

Also, a preferable mode is one wherein the first conductive thin film is formed in a non-oxidizing atmosphere.

Also, a preferable mode is one wherein reflowing of the first conductive thin film is performed in a reductive atmosphere or in a vacuum atmosphere.

Also, a preferable mode is one wherein the second conductive thin film is formed by a sputtering method or a plating method.

Also, a preferable mode is one wherein planarization of the second conductive thin film is performed by a CMP method.

Also, a preferable mode is one wherein a thickness of the first conductive thin film composed of copper only or materials in which copper forms the principal constituent thereof is 30–150 nm.

Furthermore, a preferable mode is one wherein refractory metals are used as the barrier metals.

BRIEF DESCRIPTION OF THE DRAWING

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

FIGS. 1A, 1B and 1C and FIGS. 2A, 2B and 2C are schematic sectional views illustrating, in order of processes, a method of manufacturing a semiconductor device according to a first embodiment of the present invention.

Figure 1A:
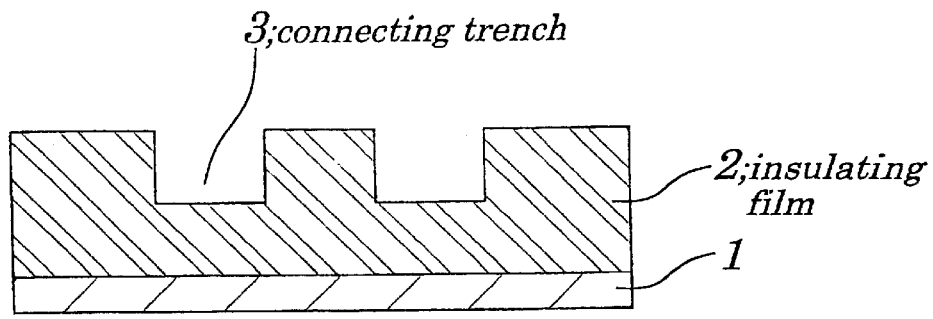
FIGS. 1A, 1B and 1C are schematic sectional views showing, in order of processes, a method for manufacturing a semiconductor device according to a first embodiment of the present invention.
Figure 1B:
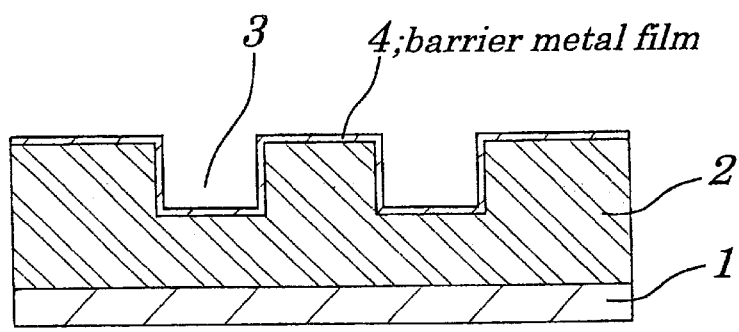
Figure 1C:
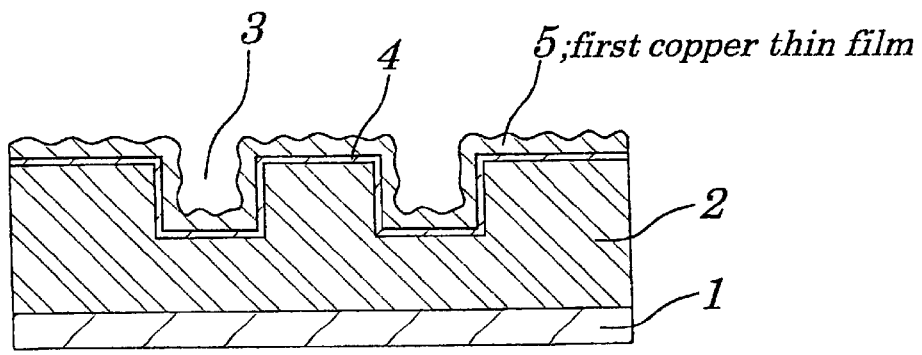
Figure 2A:
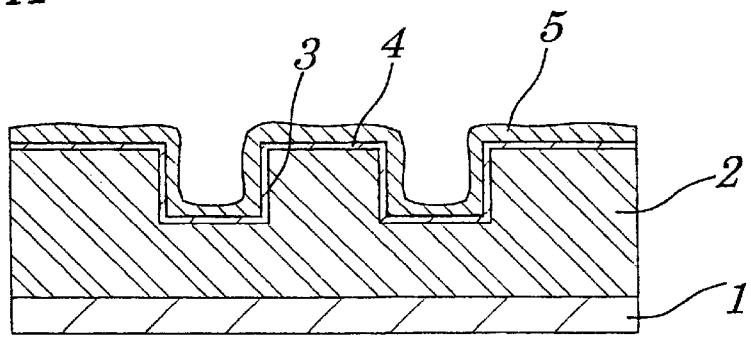
FIGS. 2A, 2B and 2C are schematic sectional views illustrating, in order of processes, the method for manufacturing semiconductor devices shown in FIGS. 1A, 1B and 1C.
Figure 2B:
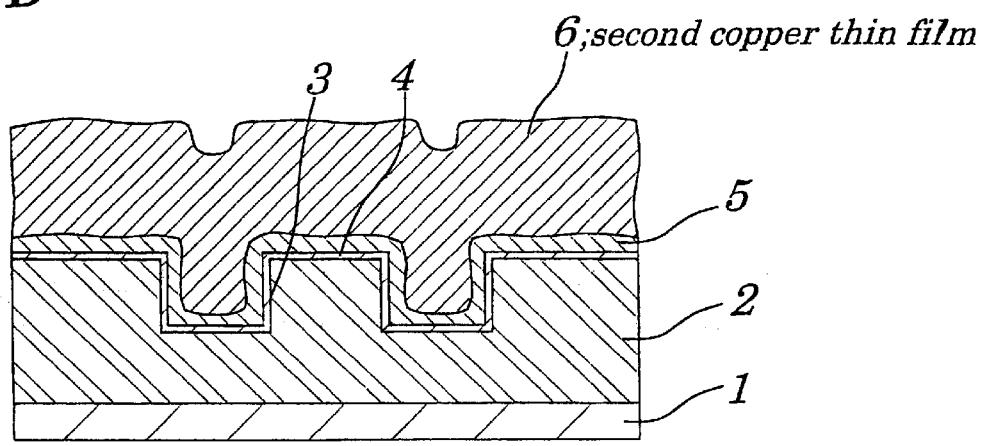
Figure 2C:
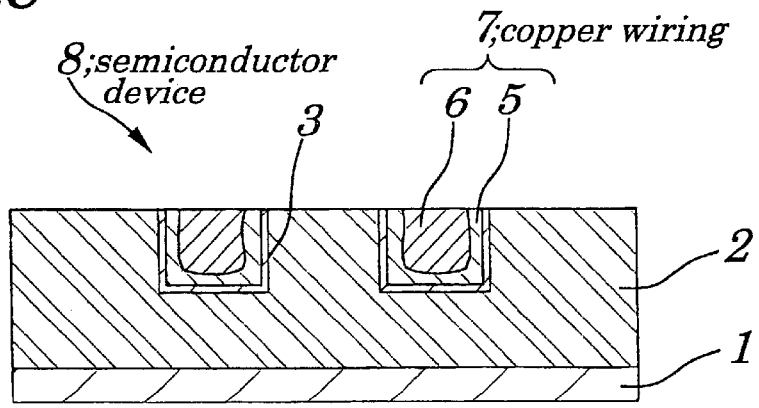
Figure 3:
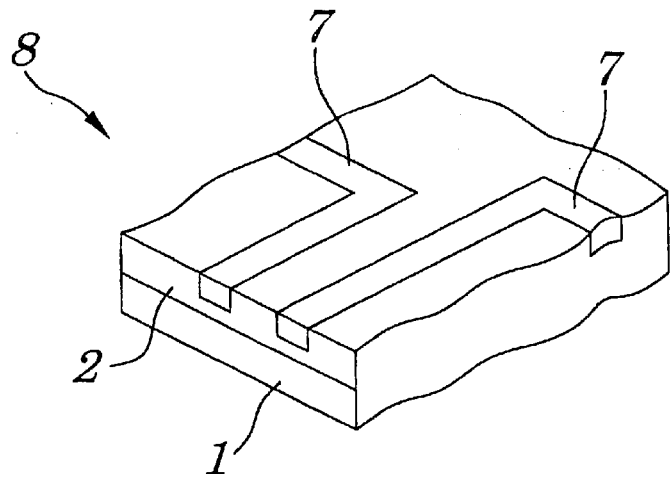
FIG. 3 is a perspective view showing the semi-conductor device manufactured by the method for manufacturing semiconductor devices shown in FIGS. 1A, 1B and 1C and FIGS. 2A, 2B and 2C.

FIG. 3 is a perspective view of a semiconductor device manufactured in accordance with the method for manufacturing semiconductor devices shown in FIGS. 1A, 1B and 1C and FIGS. 2A, 2B and 2C. The method for manufacturing semiconductor devices of the present invention is described hereafter in order of processes.

As shown in FIG. 1A, a semiconductor substrate 1 is prepared which is covered with an insulating film 2 with a film thickness of 500–1000 nm composed of, for example, a single crystal silicon having a surface coated with a silicon oxide ($SiO_2$) film. On the semiconductor substrate 1, a desired device area is formed by impurity ion implantation. Then, a connecting trench 3 with a diameter of about 0.28 $\mu$m is formed on the insulating film 2 by a dry etching method. By using a known lithography technology, the connecting trench 3 is formed so as to gain a desired depth.

As depicted in FIG. 1B, a barrier metal film 4 is then formed on the insulating film 2, including the area of the connecting trench, composed of a titanium nitride (TiN) film with a film thickness of 20 to 50 nm by a sputtering method being one of PVD methods. The barrier metal film 4 serves to inhibit the diffusion of a copper thin film to be formed in subsequent process to the insulating film 2 or semiconductor substrate 1.

Figure 4A:
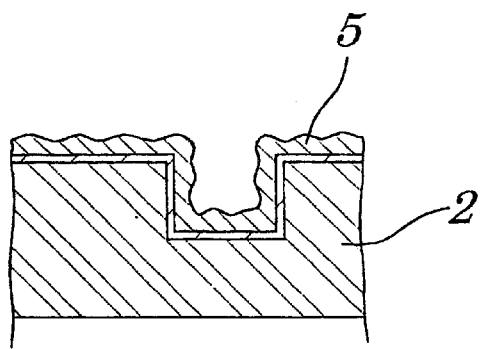
FIGS. 4A, and 4B are schematic sectional views describing the principle of the method for manufacturing semiconductor devices shown in FIG. 3.
Figure 4B:
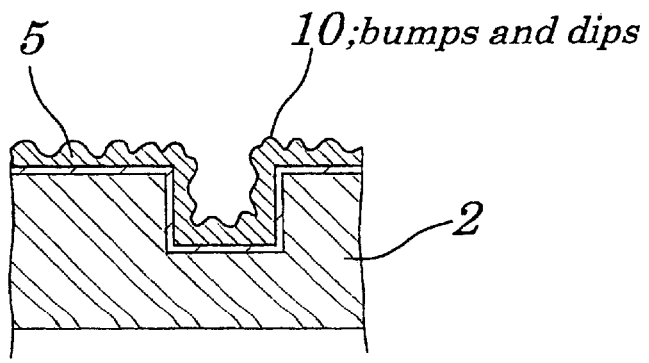

As the next step, as shown in FIG. 1C, a first copper thin film 5 with a film thickness of 30–150 nm is grown on the barrier metal film 4 by using a CVD method. In this case, a deposition rate of the first copper thin film 5 is about 30 nm/min. The thickness of the first copper film 5 is selected so that bumps and dips attributable to crystal particles do not occur virtually on the surface of the copper thin film 5. That is, when the first copper thin film 5 is grown by using the CVD method, if the film thickness is 30–150 nm as described above, almost no bumps and dips occur as seen in FIG. 4A. However, if the film thickness is 150 nm or more, as shown in FIG. 4B, bumps and dips 10 attributable to crystal particles occur on the surface of the copper thin film 5. As the film thickness becomes large, the bumps and dips 10 causes the occurrence of a void. On the other hand, the film thickness is 30 nm or less, the formation of uniform copper thin films is difficult.

A method for forming the first copper thin film 5 using the CVD method was implemented under two kinds of conditions for deposition.

Condition 1 for Deposition
Material gas: Copper hexafluoro-acetylacetonato-trimethylvinyl silane (Cu(hfac)tmvs)
Carrier gas: Helium (He)
Flow rate of carrier gas: 50–1000 sccm (standard cubic centimeter per minute)
Deposition temperature: 150–250° C.
Deposition time: 1–10 minutes
Pressure in deposition chamber: 0.1–30 Torr
Condition 2 for Deposition
Material gas: Copper cyclopentadienyl-triethyl-phosphine (CuCpTep)
Carrier gas: Helium
Flow rate of carrier gas: 50–1000 sccm
Deposition temperature: 150–300° C.
Deposition time: 1–10 minutes
Pressure in deposition chamber: 0.01–30 Torr In the above both conditions 1 and 2, the gas used as a carrier gas can be replaced with argon (Ar) and hydrogen ($H_2$). So long as a gas is non-oxidizing, it can be used as the carrier gas.

Then, as shown in FIG. 2A, by thermally treating the semiconductor substrate 1, the surface of the first copper thin film 5 is made to flow and put in reflow process. This makes the surface of the first copper thin film 5 very smooth.

A method for thermally treating for reflow is implemented under three kinds of conditions as listed below.
Condition 1 for Thermally Treating for Reflow
Atmospheric gas: Hydrogen
Flow rate of gas: 100–50000 sccm
Temperature of substrate: 350–500° C.
Condition 2 for Thermally Treating for Reflow
Atmospheric gas: Hydrogen (30–95%)+Oxygen (70–5%)
Flow rate of gas: 1000–50000 sccm
Temperature of substrate: 350–650° C.
Condition 3 for Thermally Treating for Reflow
Atmosphere: Vacuum ($10^{-6}$–$10^{-11}$ Torr)
Temperature of substrate: 350–500° C.

As above conditions 1, 2 and 3 show, the atmosphere of heat treatment for reflow includes reductive, oxidizing and vacuum atmospheres. When the heat treatment is performed in a vacuum atmosphere, the semiconductor device 1 with the first copper thin film 5 formed thereon by the CVD method is held in a vacuum without being taken out of CVD equipment and put in reflow process.

As the next step, as shown in FIG. 2B, a second copper thin film 6 with a film thickness of 1.0–2.0 µm is formed on the first copper thin film 5 by a sputtering method. This allows the second copper thin film 6 to be piled up on the upper part of the connecting trench 3. In this case, a deposition rate of the second copper thin film 6 is about 1000 nm/min. That is, the copper thin film can be formed by the sputtering method 30 times faster or more than by the CVD method. The reason for employing the sputtering method being inferior to the CVD method in terms of step coverage is that it permits copper wiring to be formed in a short time, thus making the process suitable for volume production. Because the first copper thin film 5 formed by the CVD method is a thin film being excellent in terms of step coverage and the surface of the first copper film 5 undergoes reflow processing, even though the second copper thin film 6 grown on the first copper thin film 5 is formed by the sputtering method, there is no problem in the film quality of the second copper thin film 6 accordingly.

Then, as shown in FIG. 2C, the first copper thin film 5 and the second copper thin film 6 are polished and planarized by a CMP method. By this, a semiconductor device 8 is produced which has copper wiring 7 formed by stacking and burying the first copper thin film 5 and the second copper thin film 6 in the connecting trench 3. The copper wiring 7 is connected to a device area (not shown).

FIG. 3 is a perspective view showing a complete configuration of the semiconductor device 8.

As described above, according to this embodiment, after the first copper thin film 5 having the film thickness adjusted so as not to virtually cause bumps and dips attributable to crystal particles on the surface of the film is formed by using the CVD method, with the barrier metal film 4 put between the first copper film 5 and the insulating film 2, on the insulating film 2 covering the semiconductor substrate 1 and containing the connecting trench 3, reflow processing is performed to make flowing the surface of the copper thin film 5 and, after the second copper thin film 6 having a sufficient film thickness to impart a wiring function obtained in a short time by using the sputtering method is formed on the first copper thin film 5, planarization is carried out thereon by the CMP method to form the copper wiring 7, thus enabling the reduction in the number of processes and efficient formation of copper wiring.

Accordingly, even in the case of the formation of a copper thin film having a sufficient large thickness to be applied to wiring, repeated process of forming the thin film by using the CVD method and of reflowing is not required, thus increasing productivity.

Second Embodiment

FIGS. 5A, 5B, 5C and 5D and FIGS. 6A, 6B and 6C are schematic sectional views illustrating, in order of processes, a method of manufacturing a semiconductor device according to a second embodiment of the present invention. The method for manufacturing semiconductor devices of the second embodiment is different from that of the first embodiment mainly in that a connecting hole instead of the connecting trench is used for the formation of copper wiring. The method for manufacturing semiconductor devices of the present invention is described hereafter in order of processes.

Figure 5A:
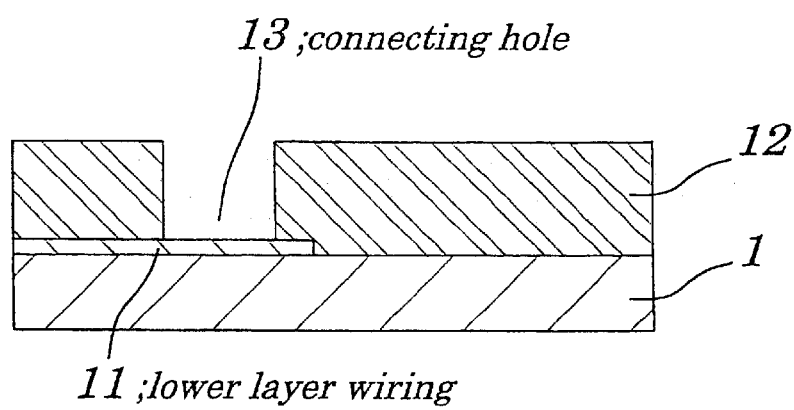
FIGS. 5A, 5B, 5C and 5D are schematic sectional views showing, in order of processes, a method for manufacturing a semiconductor device according to a second embodiment of the present invention.

Firstly, as depicted in FIG. 5A, a semiconductor substrate 1 provided in advance with a lower layer wiring 11 and covered with an insulating film 12 having a film thickness of 500–1000 nm with its surface coated with a silicon oxide film is prepared and a connecting hole 13 having a diameter of about 0.28 µm is formed on the insulating film 12 by a dry etching method.

Figure 5B:
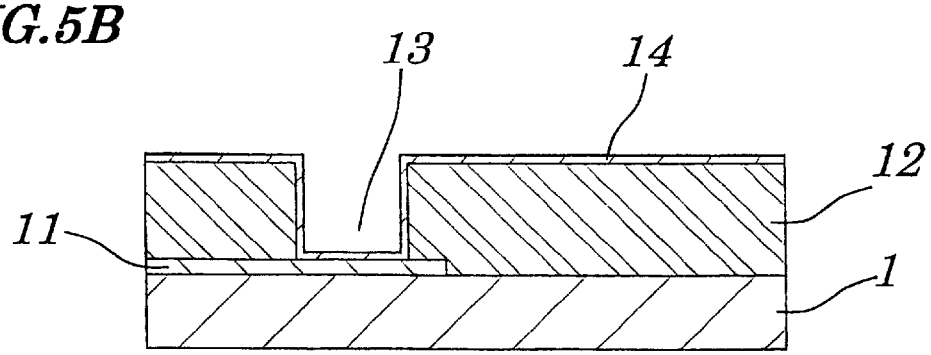

Then, a barrier metal film 14 composed of a titanium nitride film having a film thickness of 20–50 nm is formed by a sputtering method on the insulating film 12 containing the connecting hole 13 as shown in FIG. 5B.

Figure 5C:
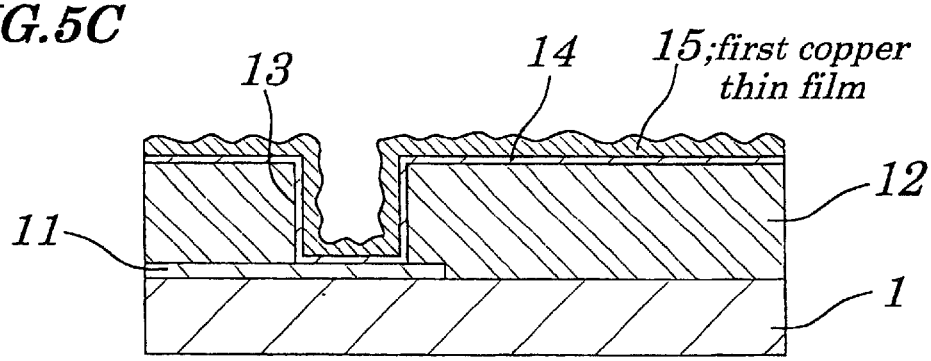

As the next step, a first copper film 15 having a film thickness of 30–150 nm is grown by using a CVD method on the barrier metal film 14 as shown in FIG. 5C. The first copper thin film 15 can be formed under almost the same conditions as in the case of the first copper thin film 5 of the first embodiment.

Figure 5D:
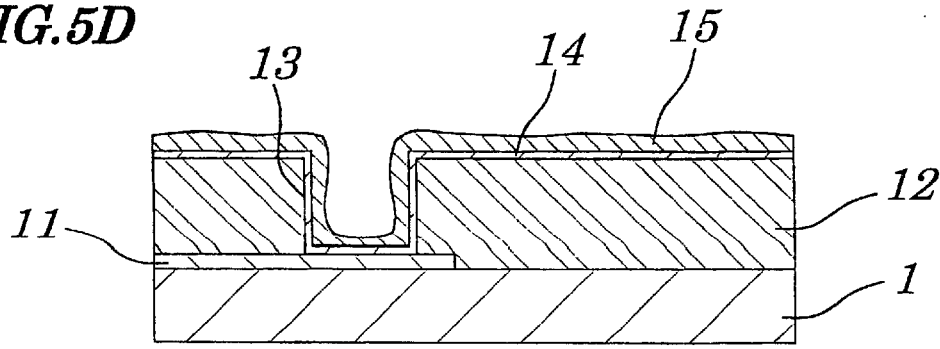

Then, as shown in FIG. 5D, by thermally treating the semiconductor substrate 1, the surface of the first copper thin film 15 is made flowing and put in reflow process. The heat treatment for reflow process can be performed under almost the same conditions as in the case of the heat treatment of the first embodiment.

Figure 6A:
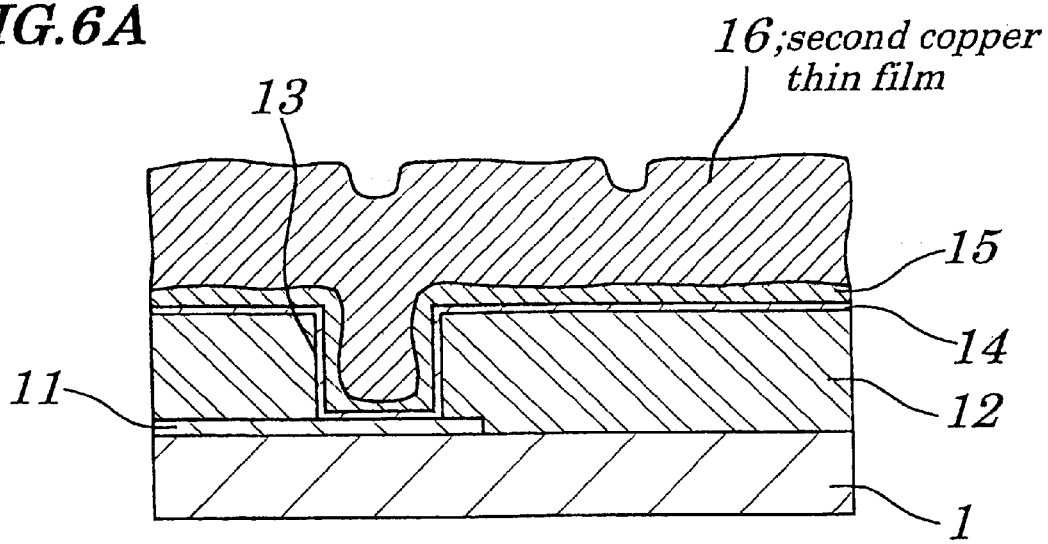
FIGS. 6A, 6B and 6C are schematic sectional views showing, in order of processes, the method for manufacturing semiconductor devices depicted in FIGS. 5A, 5B, 5C and 5D.

Moreover, a second copper thin film 16 having a film thickness of 1.0–2.0 µm is formed by a sputtering method on the first copper thin film 15 as seen in FIG. 6A. This allows the second copper thin film 16 to be piled up on the upper part of the connecting hole 13.

Because the first copper thin film 15 formed by the CVD method is a thin film being excellent in terms of step coverage and the surface of the first copper film 15 undergoes reflow processing, even though the second copper thin film 16 grown on the first copper thin film 15 is formed by the sputtering method, there is no problem in the film quality of the second copper thin film 16.

Figure 6B:
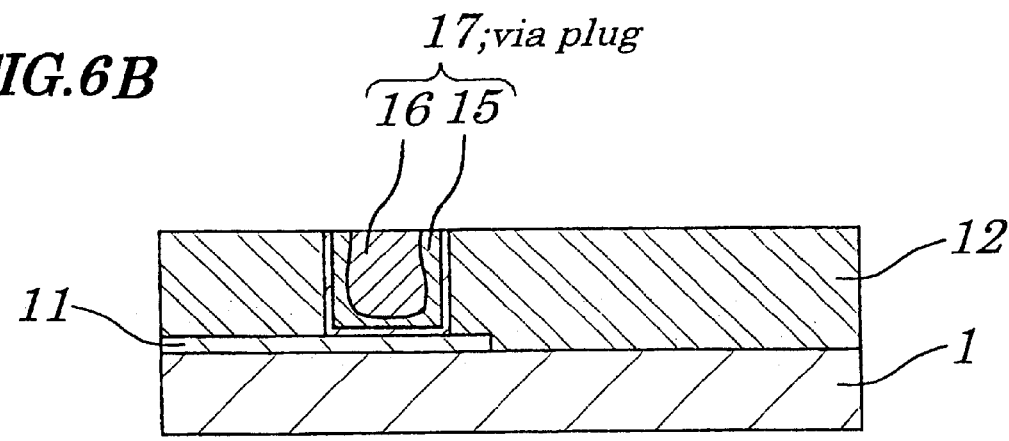
Figure 6C:
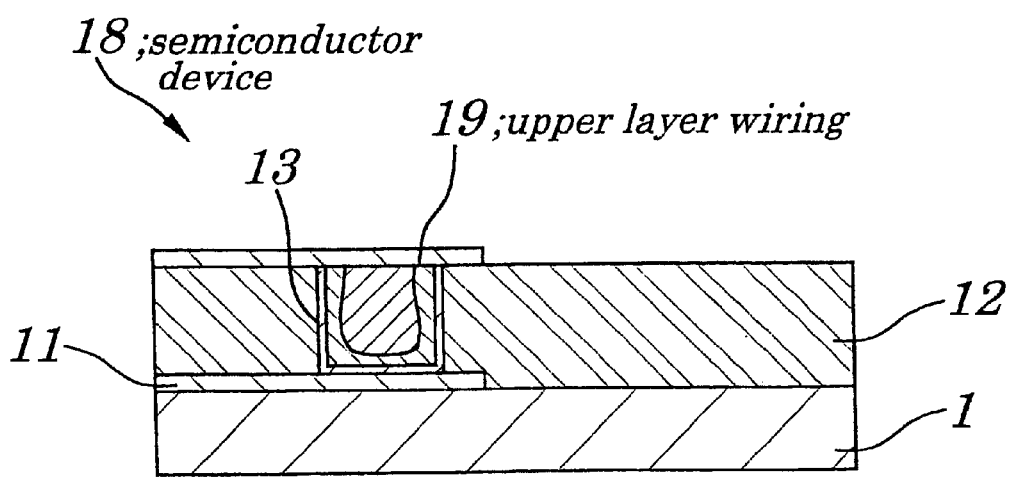
Figure 7A:
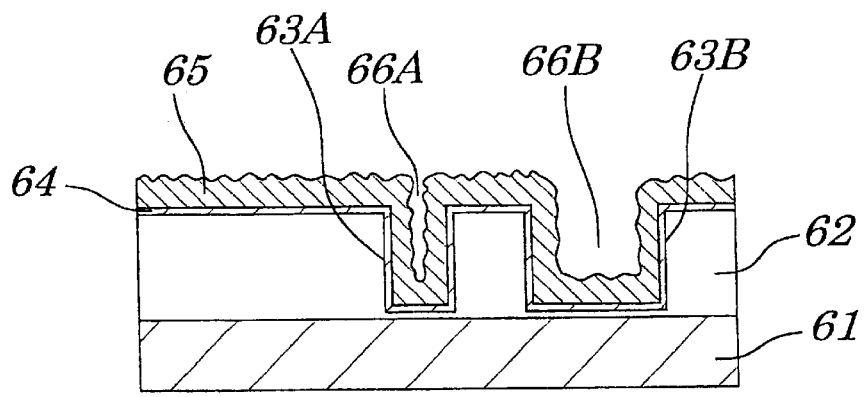
FIGS. 7A, 7B, 7C and 7D are schematic sectional views showing, in order of processes, a conventional method for manufacturing semiconductor devices.
Figure 7B:
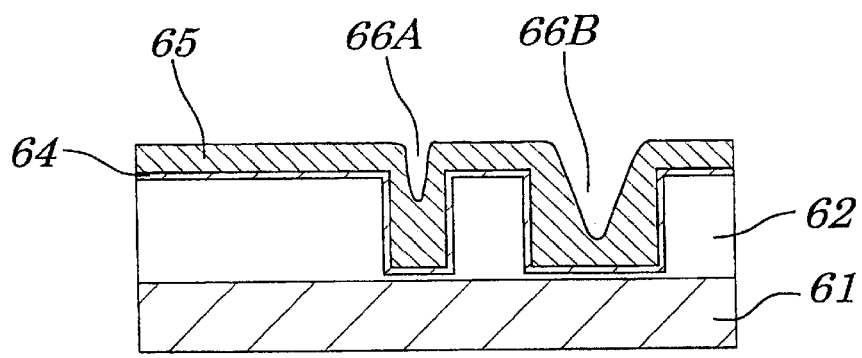
Figure 7C:
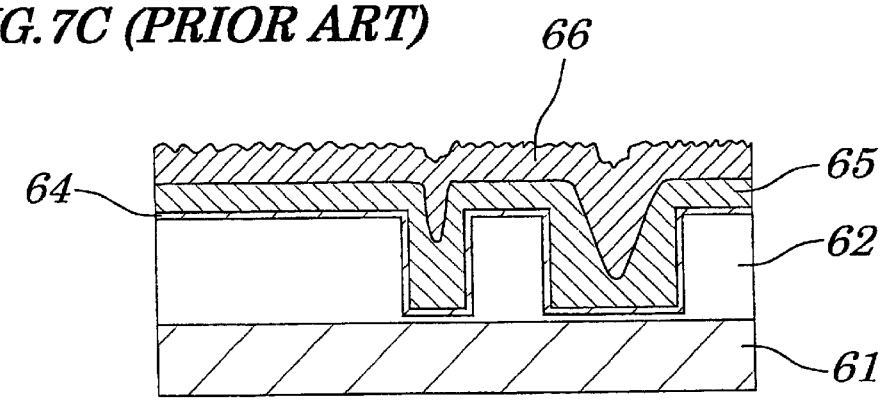
Figure 7D:
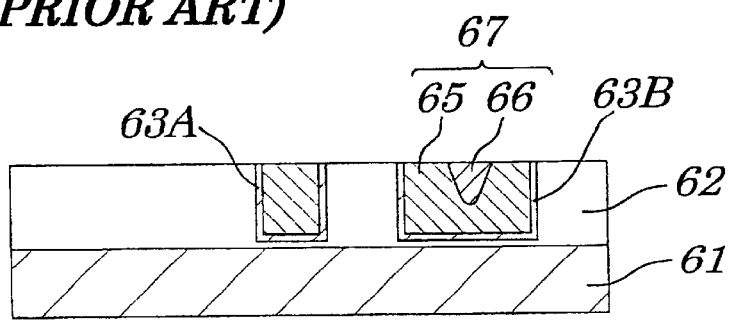

Then, as shown in FIG. 6B, the first copper thin film 15 and the second copper thin film 16 are polished and planarized by a CMP method. By this, a via plug 17 is formed by stacking and burying the first copper thin film 15 and the second copper thin film 16 in the connecting hole 13. Finally, as shown in FIG. 6G, by providing an upper layer wiring 19 on the insulating film 12 so that the upper layer wiring 19 is connected to the copper wiring 17, a semiconductor device 18 is produced wherein a lower layer wiring 11 is electrically connected through the copper wiring 17 to the upper layer wiring 19.

Thus, in this embodiment, almost the same effect is produced as described in the first embodiment.

Additionally, according to the second embodiment, requirements for copper wiring with a large film thickness such as a via plug can be met.

It is apparent that the present invention is not limited to the above embodiments but may be changed and modified without departing from the scope and spirit of the invention. For example, the CVD method wherein the thin film is formed with the film thickness adjusted so as not to virtually cause bumps and dips attributable to crystal particles on the surface of the copper thin film can be applied to not only such a copper thin film but also a film composed of other metals such as aluminum. Accordingly, the method described above can be applied to the formation of aluminum wiring with a sufficiently large thickness.

Moreover, it is not necessary to use the wiring in which copper constitutes 100% thereof and wiring containing other constituents in some degree is acceptable and further copper metals in which copper forms the principal constituent thereof may be used as well. For example, wiring containing trace amounts of refractory metals such as titanium (Ti), chromium (Cr) and the like may be effectively employed to improve reliability of wiring.

Additionally, in order to form wiring having a sufficiently large thickness, composed of copper only or materials in which copper forms the principal constituent thereof, a second conductive thin film may be formed by a plating method on a first conductive thin film grown by the CVD method. Especially, by the plating method, wiring having the excellent quality of a film and consisting of copper only or materials in which copper forms the principal constituent thereof can be easily formed.

Also, refractory metals that can be used for the barrier metal film may include not only titanium nitride but also tantalum nitride (TaN), tungsten nitride (WN), titanium tungsten (TiW), tungsten silicon nitride (WSiN), tantalum silicon nitride (TaSiN), tantalum (Ta), tungsten (W) and molybdenum (Mo) and the like.

Furthermore, the insulating film may include not only silicon oxide film but also silicon nitride, BSG (Boro Silicate Glass), PSG (Phospho Silicate Glass), BPSG (Boro-Phospho Silicate Glass) films and the like.

As described above, according to the method for manufacturing semiconductor devices of the present invention, after the first conductive thin film having a film thickness adjusted so as not to virtually cause bumps and dips attributable to crystal particles on the surface of the film is formed by the CVD method on the insulating film covering the semiconductor substrate and containing the connecting trench or connecting hole, reflow processing is performed to make flowing the surface of the conductive thin film and, after the second conductive thin film having a sufficient film thickness to impart a wiring function obtained in a short time by using methods other than the CVD method is formed on the first conductive thin film, planarization is carried out on the second conductive thin film to form wiring, thus enabling the reduction in the number of processes and efficient formation of wiring.

Accordingly, even in the case of the formation of a conductive thin film having a sufficient large thickness to be applied to wiring, repeated process of forming the thin film by the CVD method and of reflowing is not required, thus increasing productivity.

Finally, the present application claims the priority of Japanese Patent Application No. Hei10-213336 filed on Jul. 28, 1998, which is herein incorporated by reference.

What is claimed is:

1. A method for manufacturing a semiconductor device for forming wiring composed of copper only or materials in which copper forms the principal constituent thereof on a connecting trench or connecting hole of an insulating film covering a semiconductor substrate comprising the steps of:

forming, by using a CVD method, a first conductive thin film composed of copper only or materials in which copper forms the principal constituent thereof so as not to cause bumps and dips attributable to crystal particles on the surface of said thin film on said semiconductor substrate containing said connecting trench or connecting hole;

reflowing by performing heat treatment on said semiconductor substrate in a mixed reductive and oxidizing atmosphere of hydrogen and oxygen gases, to make the surface of said first conductive thin film smooth, said semiconductor substrate being at a temperature of between 350–650° C.;

flowing said hydrogen and oxygen gases at a flow rate of between 1000–50000 sccm, said first conductive thin film remaining as a thin film in said reflowing step, said first conductive thin film leaving a substantially uniform gap between walls of said connecting trench or connecting hole;

plating a second conductive thin film composed of copper only or materials in which copper forms the principal constituent thereof and having a film thickness that is larger than the depth of said connecting trench or connecting hole on said first conductive thin film; and planarizing said second conductive thin film.

2. The method for manufacturing a semiconductor device according to claim 1, wherein planarization of said second conductive thin film is performed by a CMP method.

3. The method for manufacturing a semiconductor device according to claim 1, wherein refractory metals are used as said barrier metals.

* * * * *